United States Patent
Hogan

(10) Patent No.: US 7,126,596 B1
(45) Date of Patent: Oct. 24, 2006

(54) RAIL-TO-RAIL AMPLIFIER FOR USE IN LINE-INVERSION LCD GRAYSCALE REFERENCE GENERATOR

(75) Inventor: Roderick B. Hogan, San Francisco, CA (US)

(73) Assignee: Analog Devices, Inc., Norwood, MA (US)

(*) Notice: Subject to any disclaimer, the term of this patent is extended or adjusted under 35 U.S.C. 154(b) by 436 days.

(21) Appl. No.: 10/782,025

(22) Filed: Feb. 18, 2004

(51) Int. Cl.
*G09G 5/00* (2006.01)
*G09G 3/36* (2006.01)

(52) U.S. Cl. .......... 345/211; 345/89; 345/208
(58) Field of Classification Search ......... 345/87, 345/89, 208, 209, 211–213
See application file for complete search history.

(56) References Cited

U.S. PATENT DOCUMENTS

| | | | |
|---|---|---|---|
| 6,225,992 B1 * | 5/2001 | Hsu et al. ............ | 345/211 |
| 6,677,923 B1 * | 1/2004 | Kajihara et al. ........ | 345/89 |
| 6,750,839 B1 * | 6/2004 | Hogan ................ | 345/98 |
| 6,762,737 B1 * | 7/2004 | Kajihara et al. ........ | 345/89 |
| 6,909,414 B1 * | 6/2005 | Tsuchi et al. .......... | 345/89 |
| 6,963,325 B1 * | 11/2005 | Yano et al. ........... | 345/94 |

OTHER PUBLICATIONS

Analog Devices, Integrated LCD Grayscale Generator, ADD8502, 2002, pp. 1-16.

* cited by examiner

*Primary Examiner*—Henry N. Tran
(74) *Attorney, Agent, or Firm*—Koppel, Patrick & Heybl

(57) ABSTRACT

A rail-to-rail amplifier suitable for use in a line-inversion LCD grayscale reference generator comprises a p-type differential pair and a first switchable current source which supplies tail current to the p-type pair in response to a first control signal, and an n-type pair and a second switchable current source which supplies tail current to the n-type pair in response to a second control signal; when its tail current is present, each pair provides a differential output current which varies with a differential input signal. A control circuit provides the control signals such that the first switchable current source is enabled when a voltage applied to the amplifier's input is closer to the amplifier's negative supply rail, and the second switchable current source is enabled when the applied voltage is closer to the amplifier's positive supply rail, such that only one input pair is active at any given time.

20 Claims, 6 Drawing Sheets

RAIL-TO-RAIL AMPLIFIER FOR USE IN LINE-INVERSION LCD GRAYSCALE REFERENCE GENERATOR

BACKGROUND OF THE INVENTION

1. Field of the Invention

This invention relates to the field of operational amplifiers (op amps), and particularly to rail-to-rail op amps suitable for use in a line-inversion grayscale reference generator.

2. Description of the Related Art

LCD display panels are made up of pixels, with each pixel's transparency varying with the voltage applied across it. The "source driver" circuit which provides the voltages applied to the pixels is typically a simple digital-to-analog converter (DAC). The DAC consists of a series string of resistors with a voltage connected across it such that unique voltages are produced at each resistor—resistor junction, followed by a multiplexer which passes on one of the produced voltages in response to a digital code. As the digital code to the mux is increased from zero-scale to full-scale, the voltage applied across a pixel increases linearly. Unfortunately, the relationship between pixel transparency and applied voltage is non-linear; as such, applying a drive voltage which is ¼ of full scale may not result in a ¼ brightness level from an addressed pixel.

One approach to correcting the non-linearity involves "bending" the DAC at certain points along the resistor string, using a grayscale reference generator. Several correction voltages are applied to selected resistor—resistor junctions, such that the DAC's transfer characteristic is made linear between pairs of correction points (though the DAC's overall transfer function may now be non-linear). When properly arranged, linearly incrementing the digital code to the DAC causes the transparency of a driven pixel to vary linearly.

A basic grayscale reference generator 10 and source driver 12 are shown in FIG. 1; a grayscale reference generator in combination with a source driver are referred to herein as an "LCD display driver". A pixel 14 is addressed by toggling a "gate" line (G) for the row in which the pixel resides, which closes a switch 16 to connect the pixel to a particular column line, which is driven with a source driver as described above. A desired drive voltage is applied to the pixel's column line, and is stored on a storage capacitor 18.

Another problem associated with LCD displays is "ghosting". Ghosting is avoided by maintaining a near-zero average DC voltage across the pixels. This is accomplished by periodically alternating the polarity of the voltage applied across each pixel so as to maintain a constant absolute voltage across it. For example, in FIG. 1, ghosting is avoiding by connecting the "second" terminal (19a) of each pixel 14 to a voltage VCOM, which is alternately switched between first and second voltages—typically a positive supply voltage and ground, but any two voltages could be used. Simultaneously, the polarities of the drive voltages applied to the pixel's "first" terminal (19b) are alternated in synchronization with the switching of the second terminal so as to maintain a constant absolute voltage across the pixel. A generator of this type is referred to herein as a "line-inversion" LCD grayscale reference generator.

One way of alternating the polarities of the drive voltages is shown in FIG. 1. Voltage sources (not shown) generate a set of correction voltages ($V_A, V_B, V_C, V_D, V_E$) for use when the pixel is being driven with a first polarity, and a set of correction voltages ($V_A', V_B', V_C', V_D', V_E'$) for use when the pixel is being driven with the opposite polarity. An analog multiplexer 20 receives the two sets of corrections voltages, and switches one set or the other to the resistor—resistor junctions of source driver 12 in synchronization with the switching of pixel terminal 19a. A controller 22 operates analog mux 20, source driver 12, and the switching of the pixel terminal.

Amplifiers A1–A5 are typically interposed between respective outputs of analog multiplexer 20 and source driver 12. Most of the amplifiers, particularly the "outer" amplifiers (A1, A2, A4 and A5 in this example), need to be able to swing close to their supply rails (V+ and ground in this example); a graph illustrating the input voltages that amplifiers A1–A5 might need to accommodate is shown in FIG. 1b. This requires that these outer amps be rail-to-rail amplifiers.

A typical rail-to-rail amplifier as might be used in grayscale reference generator 10 is shown in FIG. 1c. A PMOS differential input pair 24, 26 receives tail current from a current source 28, and an NMOS differential input pair 30, 32 receives tail current from a current source 34. The gates of PMOS FET 24 and NMOS FET 30 share a common input terminal (+), as do the gates of PMOS FET 26 and NMOS FET 32 (−). The pairs generate respective differential output currents that vary with the differential input voltage applied across the input terminals; an output stage 36 generates an output voltage (OUT) which varies with the differential output currents.

There are several drawbacks to the use of a rail-to-rail amplifier as shown in FIG. 1c. One disadvantage is that for some values of common-mode input voltage ($V_{cm}$), both input pairs will be operational, while for other values of $V_{cm}$ only one pair is operational. Having both pairs active consumes what may be an excessive amount of supply current.

Another disadvantage concerns the amplifier's frequency compensation scheme. Such a scheme is designed to limit the maximum amplifier bandwidth to avoid oscillation. Bandwidth varies with the transconductance of the input stage, and is greatest when both pairs are active. As such, the amplifier's compensation scheme is generally optimized for this condition. This means that the compensation becomes sub-optimal—and the amplifier's bandwidth unnecessarily limited—when only one pair is active.

SUMMARY OF THE INVENTION

A rail-to-rail amplifier is presented which overcomes the problems noted above. The amplifier is suitable for use in a line-inversion LCD grayscale reference generator, providing reduced current consumption and enabling the amplifier's compensation to be optimal regardless of the common-mode input voltage.

The present amplifier comprises a p-type differential transistor pair, and a first switchable current source which is connected to supply tail current to the pair when enabled in response to a first control signal. When tail current is supplied, the pair provides a first differential output current which varies with a differential input signal applied to differential input terminals.

The amplifier also includes an n-type differential transistor pair, and a second switchable current source which is connected to supply tail current to the n-type pair when enabled in response to a second control signal. When this tail current is supplied, the n-type pair provides a second differential output current which varies with the differential input signal applied to the differential input terminals.

An output stage receives the first and second differential output currents and produces an output voltage at an output terminal which varies with the first and second differential output currents. The output voltage is fed back to one of the differential input terminals, and the other input terminal serves as the amplifier's input.

The amplifier is connected between positive and negative supply rails. A control circuit provides the first and second control signals such that the first switchable current source is enabled and the second switchable current source is disabled when a voltage applied to the amplifier's input is closer to the negative supply rail than the positive supply rail, and such that the second switchable current source is enabled and the first switchable current source is disabled when the applied voltage is closer to the positive supply rail than the negative supply rail. In this way, only one input pair is on at any given time, regardless of the common-mode input voltage. This has the effect of reducing supply current when compared with the prior art approach. Furthermore, with only one pair active, the amplifier's frequency compensation can always be optimal since the input stage's transconductance will be relatively constant.

Further features and advantages of the invention will be apparent to those skilled in the art from the following detailed description, taken together with the accompanying drawings.

BRIEF DESCRIPTION OF THE DRAWINGS

FIG. 2b is a schematic diagram of a rail-to-rail amplifier in accordance with the present invention, as might be used by the LCD grayscale reference generator shown in FIG. 2a.

FIG. 4b is a schematic diagram of a rail-to-rail amplifier in accordance with the present invention, as might be used by the LCD grayscale reference generator shown in FIG. 4a.

DETAILED DESCRIPTION OF THE INVENTION

Figure 1A:
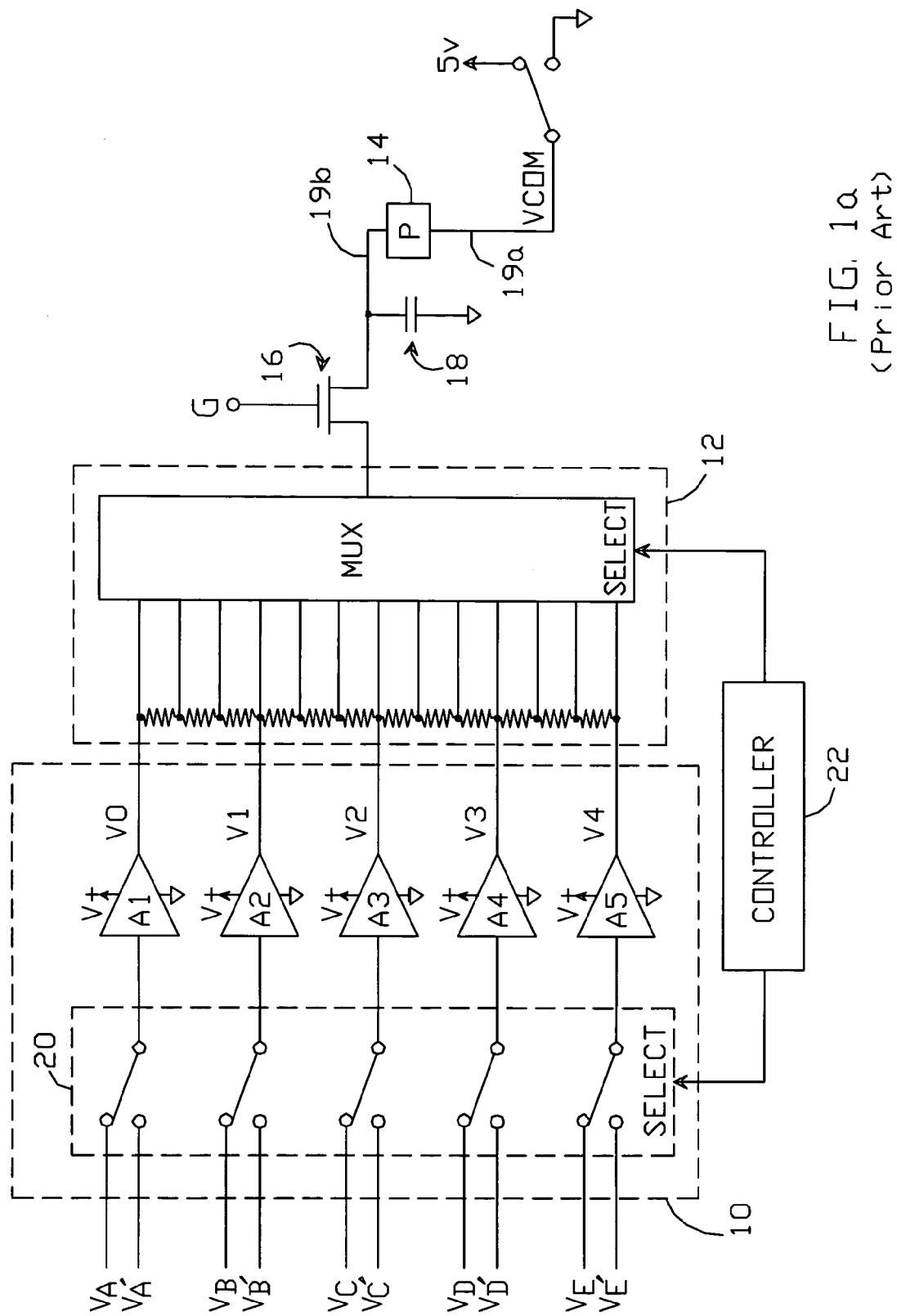
FIG. 1a is a block diagram of a known LCD display driver.
Figure 1B:
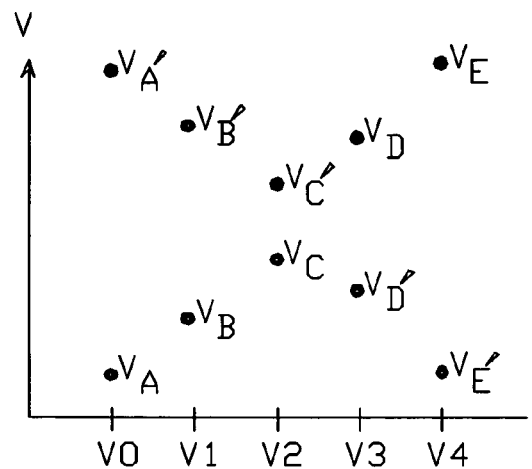
FIG. 1b is a graph illustrating voltage levels which might need to be accommodated by the grayscale reference generator which makes up part of the known LCD display driver shown in FIG. 1.
Figure 1C:
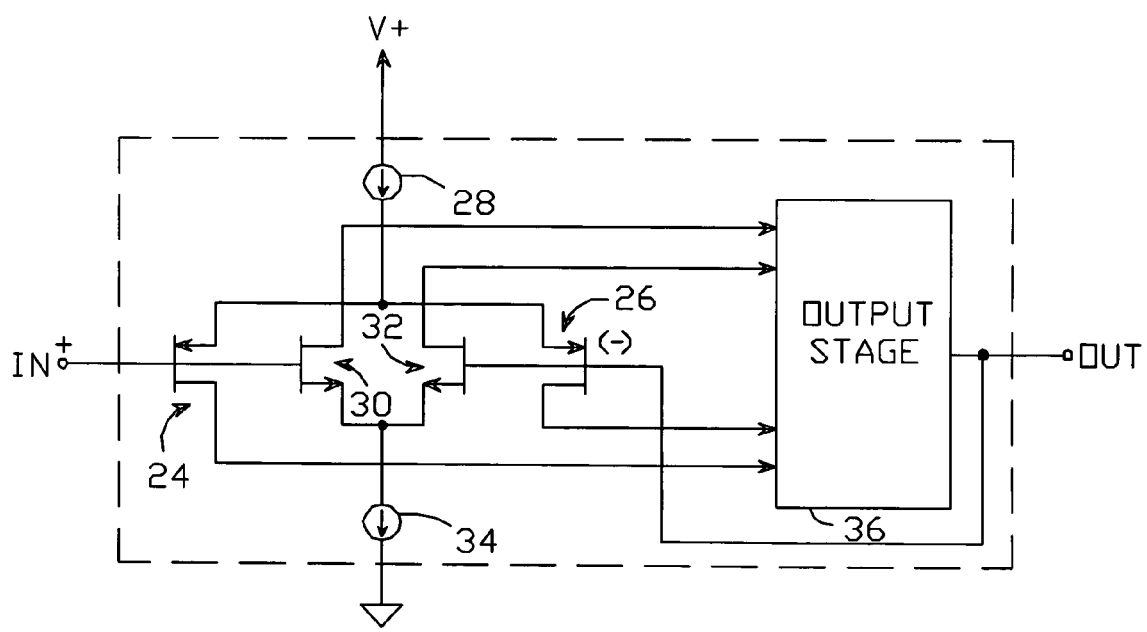
FIG. 1c is a schematic diagram of a known rail-to-rail amplifier as might be used by the grayscale reference generator shown in FIG. 1.
Figure 2A:
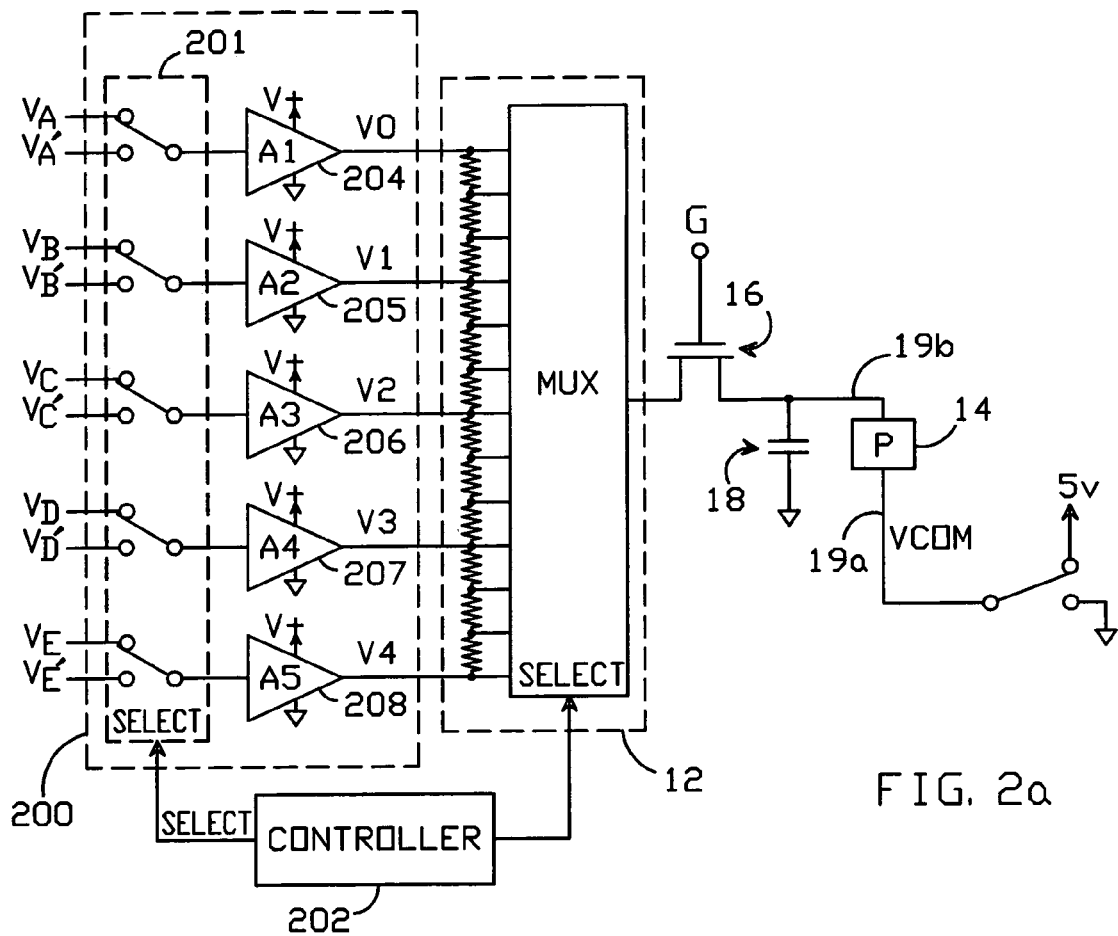
FIG. 2a is a block diagram of an LCD display driver which includes a line-inversion LCD grayscale reference generator in accordance with the present invention.

A block diagram of an exemplary embodiment of an LCD display driver which includes a line-inversion LCD grayscale reference generator 200 in accordance with the present invention is shown in FIG. 2a.

As noted above, "ghosting" is avoided by periodically alternating the polarity of the voltage applied across each pixel so as to maintain a constant absolute voltage across the pixel. This can be accomplished by, for example, connecting the "second" terminal 19a of each pixel 14 to a voltage VCOM, which is alternately switched between first and second voltages—typically a positive supply voltage and ground, but any two voltages could be used. Simultaneously, the polarities of the drive voltages applied to the pixel's "first" terminal 19b are alternated in synchronization with the switching of the second terminal so as to maintain a constant absolute voltage across the pixel.

The alternation of the drive voltages can be accomplished with the use of a "line-inversion" grayscale reference generator. In FIG. 2a, such a generator 200 provides a set of correction voltages (V0–V4) to source driver 12, which in turn drives the pixels of an LCD display panel. Voltage sources (not shown) generate a set of correction voltages ($V_A$, $V_B$, $V_C$, $V_D$, $V_E$) for use when the pixels are being driven with a first polarity, and a set of correction voltages ($V_A'$, $V_B'$, $V_C'$, $V_D'$, $V_E'$) for use when the pixels are being driven with the opposite polarity. An analog multiplexer 201 receives the two sets of corrections voltages, and switches one set or the other to the resistor—resistor junctions of source driver 12 in synchronization with the switching of pixel terminal 19a. A controller 202 provides a SELECT signal to operate analog mux 201, and also generates control signals which operate source driver 12 and the switching of pixel terminal 19a.

Amplifiers 204–208 are interposed between respective outputs of analog multiplexer 201 and source driver 12. Most of the amplifiers, particularly the "outer" amplifiers (204, 205, 207 and 208 in this example), need to be able to swing close to their supply rails (V+ and ground in this example). This requires that these amps be rail-to-rail amplifiers.

Figure 2B:
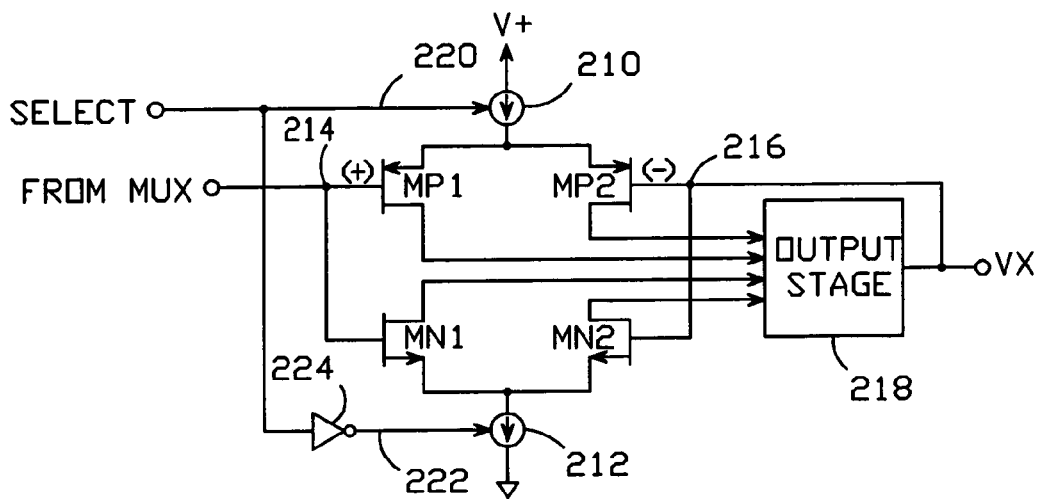

The outer amplifiers (204, 205, 207, 208) may be implemented as shown in FIG. 2b. A p-type differential transistor pair MP1 and MP2 is connected to receive tail current from a switchable current source 210, and an n-type differential pair MN1 and MN2 is connected to receive tail current from a switchable current source 212. The pairs are connected to receive a common differential input from positive and negative input terminals 214 and 216, respectively. When provided with tail current, each pair provides a differential output current that varies with a differential input signal applied to the positive and negative input terminals.

The differential output currents are provided to an output stage 218, which generates an output voltage (VX) that varies with the differential output currents. The output voltage is fed back to the amplifier's negative input terminal 216. Positive input terminal 214 serves as the amplifier's input.

The switchable current sources are enabled with respective control signals 220 and 222, which are arranged such that switchable current source 210 is enabled and switchable current source 212 is disabled when a voltage applied to amplifier input 214 is closer to the negative supply rail than the positive supply rail (i.e., applied voltage<V+/2), and such that switchable current source 212 is enabled and switchable current source 210 is disabled when the voltage applied to amplifier input 214 is closer to the positive supply rail than the negative supply rail (i.e., applied voltage>V+/$_2$). In this way, p-type differential pair MP1 and MP2 are active for lower voltages, and n-type differential pair MN1 and MN2 are active for higher voltages. Thus, rail-to-rail coverage is provided, though only one differential pair is active at any given time.

Each of amplifiers 204–208 receives one of the outputs of mux 201, with each output alternating between a higher voltage (such as $V_A$) and a lower voltage ($V_A'$). Control signals 220 and 222 are derived from the "SELECT" signal used to operate the mux; an inverter 224 might be used to provide complementary control signals to switchable current sources 210 and 212 so that one is enabled when the other is disabled. The switchable current sources and the controller are arranged such that, when the SELECT signal commands mux 201 to connect one of its outputs to the higher of its two input voltages, switchable current source 212 is enabled and current source 210 is disabled—thereby enabling the n-type pair (MN1,MN2) and disabling the p-type pair. Similarly, when SELECT changes state in order to switch the polarity of the drive voltages provided to pixel 14 and the voltage applied to a given amplifier goes from higher to lower, switchable current source 210 is enabled and current source 212 is disabled, making p-type pair (MP1,MP2) active and disabling the n-type pair.

When arranged in accordance with the present invention such that only one of the amplifier's differential pairs is active at any given time, the supply current consumed by the amplifier is reduced in comparison with prior art rail-to-rail amplifier designs. In addition, this arrangement allows the amplifier to employ a frequency compensation scheme which is optimal regardless of its common-mode input voltage. With only one pair active at any given time, the amplifier's transconductance is relatively constant and the compensation can be designed to take full advantage of the amplifier's speed capabilities.

Note that the control of amplifiers at one end (e.g., 204, 205) would be the opposite of that used at the other end (e.g., 207, 208). For example, when $V_A$ is close to the positive supply voltage, $V_E$ is necessarily close to ground, and vice versa. Thus, when the n-type pair is active in amplifier 204, the p-type pair will be active in amplifier 208.

In FIG. 2b, the present amplifier is shown configured as a unity gain buffer amplifier. The amplifier can also be configured to provide a gain other than one, in which case the amplifier's output will not be directly connected to its negative input terminal 216. Instead, the amplifier's output would typically be coupled back to its negative input terminal 216 via a resistive network.

Note that the centermost amplifier (amp 206 in FIG. 2a) need not necessarily provide rail-to-rail coverage, and thus a single differential pair amplifier might suffice. However, this amplifier is preferably also implemented in accordance with the present invention, since this simplifies the design, schematic, and layout of the grayscale reference generator.

Also note that though FIG. 2b depicts the use of PMOS and NMOS field-effect transistors (FETS) to implement the present amplifier, complementary pairs of bipolar transistors could also be employed, and the same benefits noted above realized.

Figure 3A:
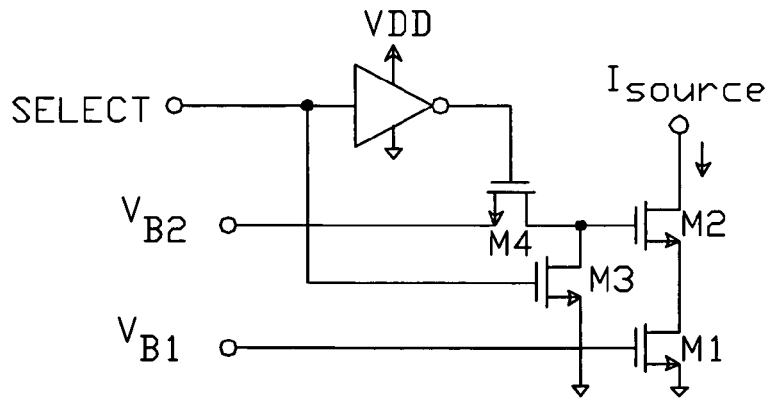
FIGS. 3a–3c are schematic diagrams of switchable current sources as might be used with the amplifiers shown in FIGS. 2b and 4b.
Figure 3B:
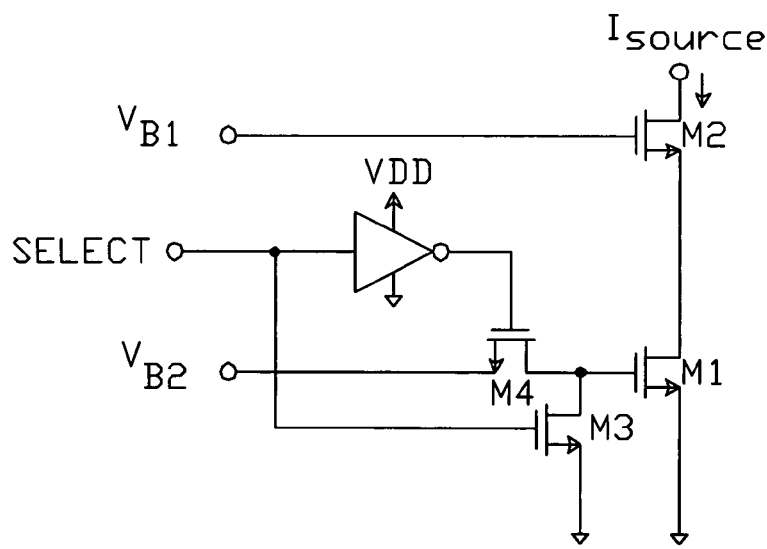
Figure 3C:
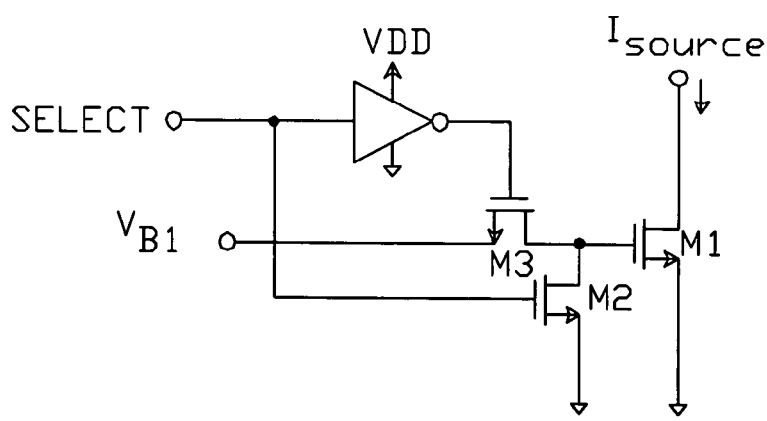

Switchable current sources 210 and 212 could be implemented in any number of ways; three possible implementations for current source 212 are shown in FIGS. 3a–3c. A switched cascode scheme is shown in FIG. 3a. FETs M1 and M2 form a cascoded current source; M1 is the current source device and M2 serves as the cascode device. M2 isolates the drain voltage of device M1 from voltage variations on the $I_{source}$ pin and thus the output impedance of the M1/M2 current source is substantially increased.

When arranged as shown in FIG. 3a, the current source is 'on' when SELECT is at 0 volts. This places FET M3 in the 'off' or high-impedance state, and places M4 in the 'on' or low-impedance state. In this mode, appropriate bias voltages $V_{B1}$ and $V_{B2}$ are connected to M1 and M2 respectively, and the current source operates normally.

In the 'off' condition, SELECT is at VDD. This places M3 in the 'on' or low-impedance state, and places M4 in the 'off' or high-impedance state. In this mode, M2 is 'off' since its gate voltage sits at 0 volts. Under this condition, no current flows into the $I_{source}$ terminal and the current source is off.

FIG. 3b depicts a switched bias scheme. M1 and M2 form a cascoded current source; M1 is the current source device, and M2 serves as the cascode device. In the 'on' condition, SELECT is at 0 volts, which turns M3 'off' and M4 'on'. In this mode, bias voltages $V_{B1}$ and $V_{B2}$ are connected to M1 and M2, respectively, and the current source operates normally.

In the 'off' condition, SELECT is at VDD, which turns M3 'on' and M4 'off'. In this mode, M1 is 'off' since its gate voltage sits at 0 volts. Under this condition, no current flows into the $I_{source}$ terminal and the current source is off.

A simple switched bias scheme is shown in FIG. 3c. Here, M1 forms a simple current source; it's output impedance will be lower than the two schemes described above. In the 'on' condition, SELECT is at 0 volts, which turns M3 'on' and M2 'off'. In this mode, bias voltage $V_{B1}$ is connected to M1 and the current source operates normally. In the 'off' condition, SELECT is at VDD, which turns M3 'off' and M4 'on'. In this mode, M1 is 'off' since its gate voltage sits at 0 volts. Under this condition, no current flows into the $I_{source}$ terminal and the current source is off.

Similar but opposite polarity implementations of the current sources shown in FIGS. 3a–3c could be used to provide switchable current source 210. Note that inverters can be used to adapt the switchable current sources for operation with either an active-high or active-low SELECT signal. The implementations shown in FIGS. 3a–3c are merely exemplary; there are numerous methods for realizing a switchable current source.

Figure 3D:
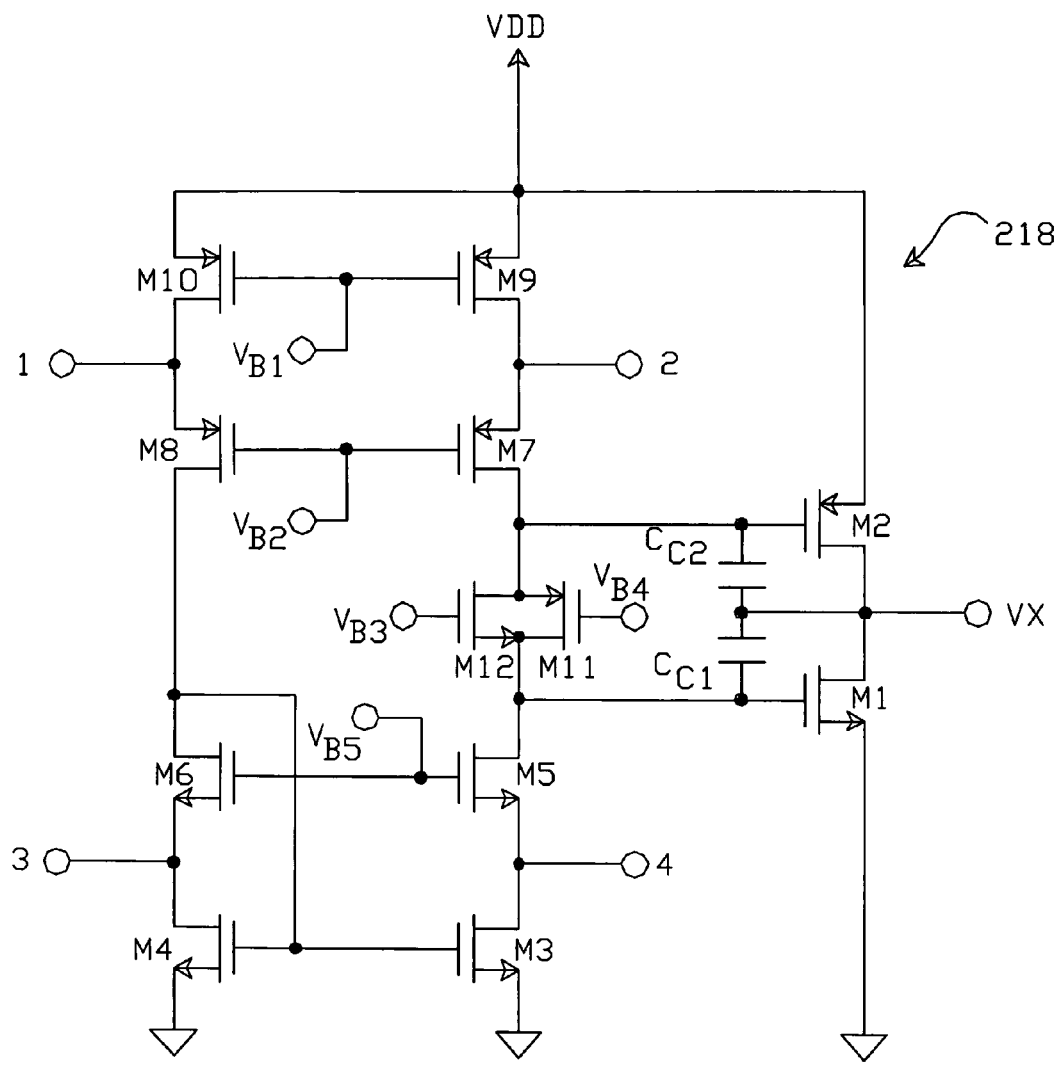
FIG. 3d is a schematic diagram of a gain stage and output stage as might be used with the amplifiers shown in FIGS. 2b and 4b.

Output stage 218 can also be implemented in many different ways. One possible embodiment of output stage 218 is shown in FIG. 3d, which includes a folded cascode gain stage, a rail-to-rail output stage, and a compensation network.

Stage 218 has four input terminals, which receive the differential output currents produced by input FETs MN1, MN2, MP1 and MP2. The drains of NMOS FETs MN1 and MN2 connect to terminals 1 and 2, and the drains of PMOS FETs MP1 and MP2 connect to terminals 3 and 4.

Devices M1 and M2 form a rail-to-rail output stage. Capacitors $C_{C1}$ and $C_{C2}$ are connected across M1 and M2, respectively, and compensate the amplifier by limiting its bandwidth to some practical value.

PMOS devices M9 and M10 form two current sources, which are cascoded with PMOS devices M7 and M8, respectively. NMOS devices M3 and M4 form a current mirror, and are cascoded with NMOS devices M5 and M6, respectively. PMOS FET M11 and NMOS FET M12 set the quiescent gate voltages on output devices M1 and M2, thereby setting up the quiescent current in the output stage.

This design requires 5 different bias voltages VB1–VB5 to be generated. VB1 provides the gate voltage for current source devices M9 and M10; this voltage determines the current that will flow in each leg of the gain stage (one leg comprising M10, M8, M6 and M4, one leg comprising M9, M7, M11, M12, M5 and M3). Devices M7 and M8 act as cascode devices for M9 and M10, respectively. The voltage on VB2 needs to be sufficient to bias M9 and M10 such that they function as current sources. VB5 biases the cascode devices M5 & M6 with the same intent. VB3 sets up the gate voltage on the output device M1, so that the desired amount of quiescent current flows in the output stage formed by M1 and M2. In a similar manner, VB4 sets up the gate voltage on M2, so that the desired amount of quiescent current flows in the output stage formed by M1 and M2.

When arranged as described herein, only one input pair 10 is active at any one time. As such, capacitors $C_{C1}$ and $C_{C2}$ can be selected to optimally compensate the amplifier regardless of its common-mode input voltage. With only one pair active at any given time, the amplifier's transconductance is relatively constant and the compensation can be designed to take full advantage of the amplifier's speed capabilities.

Figure 4A:
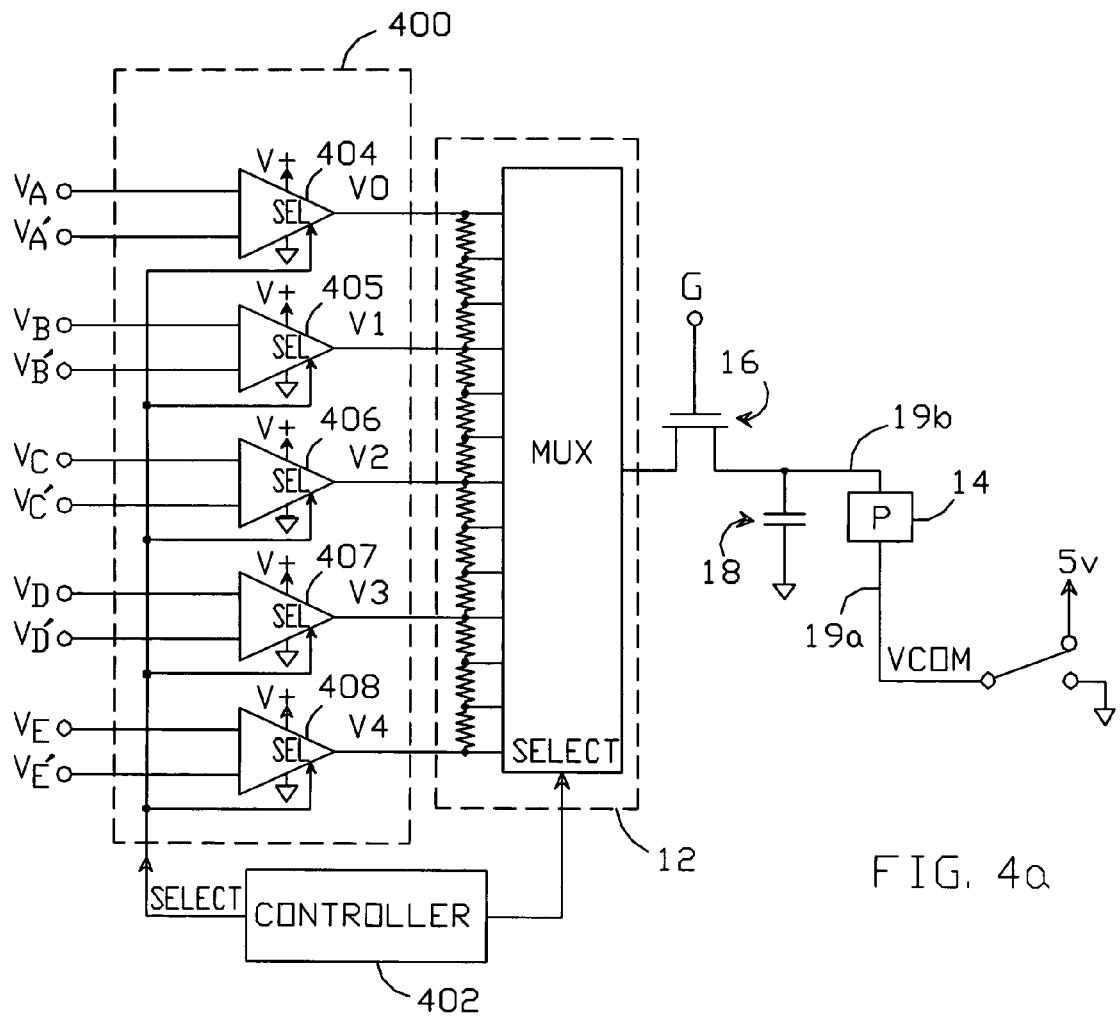
FIG. 4a is a block diagram of an LCD display driver which includes another embodiment of a line-inversion LCD grayscale reference generator in accordance with the present invention.

An alternative embodiment of a line-inversion grayscale reference generator in accordance with the present invention, suitable for use in an LCD display panel, is shown in FIG. 4a. As before, ghosting is avoided by periodically alternating the polarity of the voltage applied across each pixel so as to maintain a constant absolute voltage across the pixel. This can be accomplished by connecting the "second" terminal 19a of each pixel 14 to voltage VCOM which is alternately switched between first and second voltages, and simultaneously alternating the polarities of the drive voltages applied to the pixel's "first" terminal 19b in synchronization with the switching of terminal 19a so as to maintain a constant absolute voltage across the pixel.

As previously noted, the alternation of the drive voltages can be accomplished with the use of a line-inversion grayscale reference generator. In FIG. 4a, such a generator 400 provides a set of correction voltages (V0–V4) to source driver 12, which in turn drives the pixels of an LCD display panel. Voltage sources (not shown) generate a set of correction voltages ($V_A$, $V_B$, $V_C$, $V_D$, $V_E$) for use when the pixel is being driven with a first polarity, and a set of correction voltages ($V_A'$, $V_B'$, $V_C'$, $V_D'$, $V_E'$) for use when the pixel is being driven with the opposite polarity.

In this embodiment, the need for an analog multiplexer is eliminated. A set of amplifiers 404–408 is interposed between the voltage sources and source driver 12, with each amplifier receiving two voltages—one from each set of correction voltages—such as $V_A$ and $V_A'$, $V_B$ and $V_B'$, etc. A controller 402 provides a SELECT signal to each amplifier, which determines which input voltage each amplifier is to amplify. Controller 402 also generates control signals which operate source driver 12 and the switching of pixel terminal 19a.

Figure 4B:
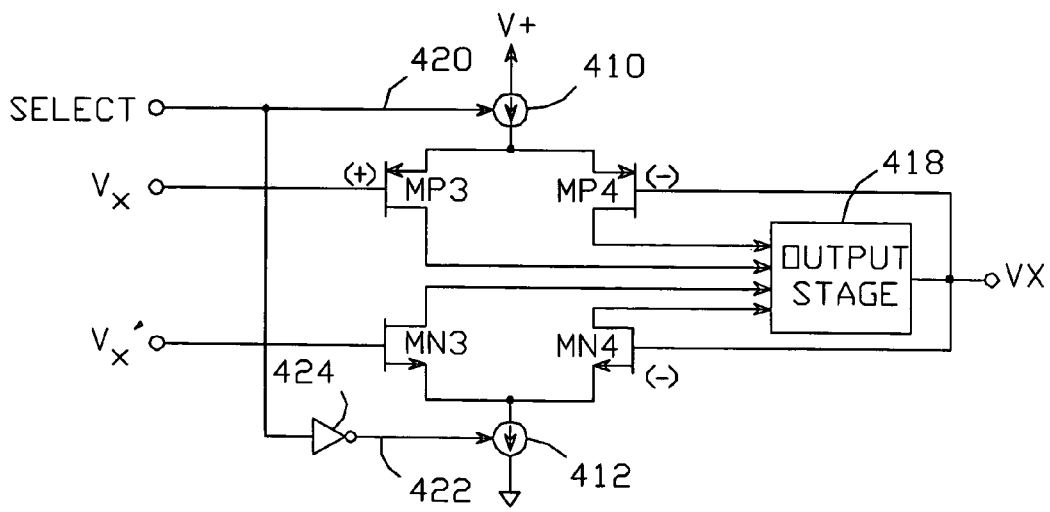

Most of the amplifiers, particularly the "outer" amplifiers (404, 405, 407 and 408 in this example), need to be able to swing close to their supply rails. This requires that these amps be rail-to-rail amplifiers. The outer amplifiers (404, 405, 407, 408) may be implemented as shown in FIG. 4b. A p-type differential transistor pair MP3 and MP4 is connected to receive tail current from a switchable current source 410, and an n-type differential pair MN3 and MN4 is connected to receive tail current from a switchable current source 412.

As noted above, each amplifier receives two voltages—one from each set of correction voltages—such as $V_A$ and $V_A'$ (shown in FIG. 4b as $V_X$ and $V_X'$). One of the voltages will be <V+/2, while the other is >V+/2. The input voltage which is closer to the positive supply voltage ($V_X'$ is this example) is connected to the control input of one of the n-type pair transistors (MN3), and the input voltage which is closer to the negative supply voltage ($V_X$) is connected to the control input of one of the p-type pair transistors (MP3). When provided with tail current, each pair provides a differential output current that varies with a differential input signal applied to the pair's control inputs.

The differential output currents are provided to an output stage 418, which generates an output voltage (VX) which varies with the differential output currents. The output voltage is fed back to the other control inputs of both pairs (MP4 and MN4).

The switchable current sources are enabled with respective control signals 420 and 422, which are arranged such that switchable current source 410 is enabled and switchable current source 412 is disabled when the input voltage applied to MP3 is to be amplified, and such that switchable current source 412 is enabled and switchable current source 410 is disabled when the input voltage applied to MN3 is to be amplified.

The "input voltage to be amplified" is determined by controller 402, which generates a SELECT signal of appropriate polarity. Here, however, rather than controlling an analog mux, the SELECT signal is used to directly control switchable current sources 410 and 412. Control signals 420 and 422 are derived from the "SELECT" signal; an inverter 424 might be used to provide complementary control signals to switchable current sources 410 and 412, so that one is enabled when the other is disabled. The switchable current sources and the controller are arranged such that, when the higher of the two input voltages is to be amplified, the SELECT signal enables switchable current source 412 and disables current source 410—thereby enabling the n-type pair (MN3,MN4) and disabling the p-type pair. Similarly, when SELECT changes state in order to switch the polarity of the drive voltages provided to pixel 14, switchable current source 410 is enabled and current source 412 is disabled, making p-type pair (MP3,MP4) active and disabling the n-type pair.

In this way, p-type differential pair MP3 and MP4 are active for lower voltages, and n-type differential pair MN3 and MN4 are active for higher voltages. Thus, rail-to-rail coverage is provided, though only one differential pair is active at any given time.

Note that the control of amplifiers at one end (e.g., 404, 405) would be the opposite of that used at the other end (e.g., 407, 408). For example, when $V_A$ is close to the positive supply voltage, $V_E$ is necessarily close to ground, and vice versa. Thus, when the n-type pair is active in amplifier 404, the p-type pair will be active in amplifier 408.

This circuit arrangement also provides the advantages discussed above for the FIG. 2a configuration. The supply current consumed by the amplifier is reduced in comparison with prior art rail-to-rail amplifier designs. In addition, this arrangement allows the amplifier to employ a frequency compensation scheme which is optimal regardless of its common-mode input voltage. With only one pair active at any given time, the amplifier's transconductance is relatively constant and the compensation can be designed to take full advantage of the amplifier's speed capabilities.

As with the amplifier shown in FIG. 2b, the FIG. 4b amplifier is shown configured as a unity gain buffer amplifier. This amplifier can also be configured to provide a gain other than one, in which case the amplifier's output will not be directly connected to the control inputs of MP4 and MN4. Instead, the amplifier's output would typically be coupled back to the control inputs of MP4 and MN4 via respective resistive networks.

Switchable current sources 410 and 412 are suitably implemented as described above in conjunction with FIGS. 3a–3c; many other possible implementations are also possible. Output stage 418 is suitably implemented as described above in conjunction with FIG. 3d; many other possible implementations are also possible.

While particular embodiments of the invention have been shown and described, numerous variations and alternate embodiments will occur to those skilled in the art. Accordingly, it is intended that the invention be limited only in terms of the appended claims.

I claim:

1. A line-inversion LCD display driver, comprising:
   a source driver suitable for switching one of a plurality of drive voltages to a column of LCD pixels in response to a digital code word, the transparency of each of said pixels varying over a predetermined pixel voltage range, each of said pixels receiving said selected drive voltage at its first terminal and alternately switched between first and second voltages at its second terminal, said source driver comprising a plurality of resistors connected in series and having accessible connection points at each end of said series string and at various resistor—resistor junctions along said series string, said series string producing at least some of said drive voltages when said connection points are connected to respective correction voltages, and
   a grayscale reference generator circuit, comprising:
      a plurality of voltage sources, each of which is arranged to output a respective correction voltage,
      an interface circuit interposed between said voltage sources and said connection points, comprising:
         a plurality of amplifiers, each of said amplifiers comprising:
            an input which is coupled to first and second ones of said correction voltages, said first correction voltage closer to said negative supply rail than said positive supply rail and said second correction voltage closer to said positive supply rail than said negative supply rail,
            positive and negative supply rails,
            a p-type differential transistor pair,
            a first switchable current source connected to supply tail current to said p-type differential pair when enabled in response to a first control signal, said p-type differential pair connected to provide a first differential output current when said tail current is supplied which varies with a differential input signal applied to said p-type pair's control inputs,
            an n-type differential transistor pair,
            a second switchable tail current source connected to supply tail current to said n-type differential pair when enabled in response to a second control signal, said n-type differential pair connected to provide a second differential output current when said tail current is supplied which varies with a differential input signal applied to said n-type pair's control inputs,
            an output stage which receives said first and second differential output currents and is arranged to produce an output voltage at an output terminal which varies with said first and second differential output currents, said output terminal being said amplifier's output, and
            a control circuit which provides said first and second control signals such that said first switchable current source is enabled and said second switchable current source is disabled when said first correction voltage is to be coupled to one of said connection points, and said second switchable current source is enabled and said first switchable current source is disabled when said second correction voltage is to be coupled to one of said connection points.

2. The LCD display driver of claim 1, further comprising a plurality of two-to-one multiplexers, each of which is connected at its inputs to respective ones of said first and second correction voltages and which provides one or the other of said first and second correction voltages at its output in response to said control signals, the control inputs of one transistor from each differential pair connected to a respective one of said analog mux outputs, said control circuit arranged to operate said mux and said switchable current sources such that said first and second correction voltages are alternately connected to said connection points in synchronization with the switching of said pixels' second terminal such that the polarity of the voltages across said pixels is periodically reversed.

3. The LCD display driver of claim 1, wherein the control inputs of one transistor from each differential pair are connected to respective ones of said first and second correction voltages, said control circuit arranged to operate said switchable current sources such that said first and second correction voltages are alternately connected to said connection points in synchronization with the switching of said pixels' second terminal such that the polarity of the voltages across said pixels is periodically reversed.

4. A rail-to-rail amplifier suitable for use in a line-inversion LCD grayscale reference generator circuit, comprising:
   positive and negative supply rails,
   positive and negative input terminals,
   a p-type differential transistor pair,
   a first switchable current source connected to supply tail current to said p-type differential pair when enabled in response to a first control signal, said p-type differential pair connected to provide a first differential output current when said tail current is supplied which varies with a differential input signal applied to said positive and negative input terminals,
   an n-type differential transistor pair,
   a second switchable tail current source connected to supply tail current to said n-type differential pair when enabled in response to a second control signal, said n-type differential pair connected to provide a second differential output current when said tail current is supplied which varies with a differential input signal applied to said positive and negative input terminals,
   an output stage which receives said first and second differential output currents and is arranged to produce an output voltage at an output terminal which varies with said first and second differential output currents, said output terminal being said amplifier's output, said output voltage coupled back to said negative input terminal, said positive input terminal being said amplifier's input, and
   a control circuit which provides said first and second control signals such that said first switchable current source is enabled and said second switchable current source is disabled when a voltage applied to said amplifier's input is closer to said negative supply rail than said positive supply rail, and said second switchable current source is enabled and said first switchable current source is disabled when the voltage applied to said amplifier's input is closer to said positive supply rail than said negative supply rail.

5. The amplifier of claim 4, wherein said output voltage is directly connected to said negative input terminal such that said amplifier operates as a unity gain buffer amplifier.

6. The amplifier of claim 4, wherein said output voltage is connected to said negative input terminal via a gain network such that said amplifier provides a gain other than one.

7. The amplifier of claim 4, wherein said p-type differential pair are PMOS field-effect transistors (FETs) having their sources connected to said first switchable current source, their gates connected to said positive and negative input terminals, and their drains connected to said output stage, and said n-type differential pair are NMOS FETs having their sources connected to said second switchable current source, their gates connected to said positive and negative input terminals, and their drains connected to said output stage.

8. The amplifier of claim 4, further comprising a multiplexer arranged to provide a first voltage to said amplifier's input when said first switchable current source is enabled and a second voltage to said amplifier's input when said second switchable current source is enabled.

9. The amplifier of claim 4, wherein said p-type pair and said n-type pair each have an associated transconductance value of approximately $g_m$, said output stage including a compensation network which limits the maximum amplifier bandwidth to avoid oscillation based on said transconductance value $g_m$.

10. The amplifier of claim 9, wherein said output stage includes a folded cascade gain stage and a rail-to-rail output stage,
said rail-to-rail output stage comprising first and second complementary transistors connected to conduct respective currents to a common output node in response to first and second voltages applied to their respective control inputs,
said folded cascode gain stage arranged to receive said differential output currents and provide said first and second voltages to said first and second complementary transistors,
said compensation network comprising a first capacitor connected between the control input of said first complementary transistor and said common output node, and a second capacitor connected between the control input of said second complementary transistor and said common output node.

11. The amplifier of claim 4, wherein each of said switchable tail current sources comprise:
a bias voltage,
a current source transistor which conducts said tail current when biased with a bias voltage, and
a switching transistor which couples said bias voltage to said current source in response to said first control signal.

12. A line-inversion LCD display driver, comprising:
a source driver suitable for switching one of a plurality of drive voltages to a column of LCD pixels in response to a digital code word, the transparency of each of said pixels varying over a predetermined pixel voltage range, each of said pixels receiving said selected drive voltage at its first terminal and alternately switched between first and second voltages at its second terminal, said source driver comprising a plurality of resistors connected in series and having accessible connection points at each end of said series string and at various resistor—resistor junctions along said series string, said series string producing at least some of said drive voltages when said connection points are connected to respective correction voltages, and
a grayscale reference generator circuit, comprising:
a plurality of voltage sources, each of which is arranged to output a respective correction voltage,
an analog multiplexer connected between said voltage sources and said resistor connection points and arranged to connect said correction voltages to respective connection points such that said series string produces a desired array of drive voltages, said analog multiplexer arranged to switch the correction voltages connected to said connection points in synchronization with the switching of said pixels' second terminal such that the polarity of the voltages across said pixels is periodically reversed, and
a plurality of amplifiers interposed between said analog multiplexer and said resistor connection points, each of said amplifiers comprising:
positive and negative supply rails,
positive and negative input terminals,
a p-type differential transistor pair,
a first switchable current source connected to supply tail current to said p-type differential pair when enabled in response to a first control signal, said p-type differential pair connected to provide a first differential output current when said tail current is supplied which varies with a differential input signal applied to said positive and negative input terminals,
an n-type differential transistor pair,
a second switchable tail current source connected to supply tail current to said n-type differential pair when enabled in response to a second control signal, said n-type differential pair connected to provide a second differential output current when said tail current is supplied which varies with a differential input signal applied to said positive and negative input terminals,
an output stage which receives said first and second differential output currents and is arranged to produce an output voltage at an output terminal which varies with said first and second differential output currents, said output terminal being said amplifier's output, said output voltage coupled back to said negative input terminal, said positive input terminal being said amplifier's input, and
a control circuit which provides said first and second control signals such that said first switchable current source is enabled and said second switchable current source is disabled when the voltage applied to said amplifier's input is closer to said negative supply rail than said positive supply rail, and said second switchable current source is enabled and said first switchable current source is disabled when the voltage applied to said amplifier's input is closer to said positive supply rail than said negative supply rail,
each of said amplifier inputs connected to a respective one of the switched correction voltages from said analog multiplexer and each of said amplifier outputs connected to a respective one of resistor connection points.

13. A rail-to-rail amplifier suitable for use in a line-inversion LCD grayscale reference generator circuit, comprising:
positive and negative supply rails,
first and second voltages, said first voltage closer to said negative supply rail than said positive supply rail, and said second voltage closer to said positive supply rail than said negative supply rail, first and second p-type transistors having respective control inputs, said first p-type transistor's control input connected to said first voltage, a first switchable current source connected to supply tail current to said p-type transistors when enabled in response to a first control signal, said p-type transistors connected to provide a first differential output current when said tail current is supplied which varies with a differential input signal applied to said p-type transistors' control inputs, first and second n-type transistors having respective control inputs, said first n-type transistor's control input connected to said second voltage, a second switchable tail current source connected to supply tail current to said n-type transistors when enabled in response to a second control signal, said n-type transistors connected to provide a second differential output current when said tail current is supplied which varies with a differential input signal applied to said n-type transistors' control inputs, an output stage which receives said first and second differential output currents and is arranged to produce an output voltage at an output terminal which varies with said first and second differential output currents, said output terminal being said amplifier's output, said output voltage coupled back to said second control inputs, and a control circuit which provides said first and second control signals such that said first switchable current source is enabled and said second switchable current source is disabled when said first voltage is to be amplified by said amplifier, and said second switchable current source is enabled and said first switchable current source is disabled when said second voltage is to be amplified by said amplifier.

14. The amplifier of claim 13, wherein said output voltage is directly connected to said second control inputs such that said amplifier operates as a unity gain buffer amplifier.

15. The amplifier of claim 13, wherein said output voltage is connected to said second control inputs via a gain network such that said amplifier provides a gain other than one.

16. The amplifier of claim 13, wherein said first and second p-type transistors are PMOS field-effect transistors (FETs) having their sources connected to said first switchable current source, their gates connected to said first voltage and said output terminal, respectively, and their drains connected to said output stage, and said first and second n-type transistors are NMOS FETs having their sources connected to said second switchable current source, their gates connected to said second voltage and said output terminal, and their drains connected to said output stage.

17. The amplifier of claim 13, wherein said p-type pair and said n-type pair each have an associated transconductance value of approximately $g_m$, said output stage including a compensation network which limits the maximum amplifier bandwidth to avoid oscillation based on said transconductance value $g_m$.

18. The amplifier of claim 17, wherein said output stage includes a folded cascode gain stage and a rail-to-rail output stage, said rail-to-rail output stage comprising first and second complementary transistors connected to conduct respective currents to a common output node in response to first and second voltages applied to their respective control inputs, said folded cascode gain stage arranged to receive said differential output currents and provide said first and second voltages to said first and second complementary transistors, said compensation network comprising a first capacitor connected between the control input of said first complementary transistor and said common output node, and a second capacitor connected between the control input of said second complementary transistor and said common output node.

19. The amplifier of claim 13, wherein each of said switchable tail current sources comprise:

a bias voltage, a current source transistor which conducts said tail current when biased with a bias voltage, and a switching transistor which couples said bias voltage to said current source in response to said first control signal.

20. A line-inversion LCD display driver, comprising:

a source driver suitable for switching one of a plurality of drive voltages to a column of LCD pixels in response to a digital code word, the transparency of each of said pixels varying over a predetermined pixel voltage range, each of said pixels receiving said selected drive voltage at its first terminal and alternately switched between first and second voltages at its second terminal, said source driver comprising a plurality of resistors connected in series and having accessible connection points at each end of said series string and at various resistor—resistor junctions along said series string, said series string producing at least some of said drive voltages when said connection points are connected to respective correction voltages, and a grayscale reference generator circuit, comprising:

positive and negative supply rails, a plurality of voltage sources providing respective correction voltages, half of said voltage sources providing correction voltages which are closer to said negative supply rail than said positive supply rail, and half of said voltage sources providing correction voltages which are closer to said positive supply rail than said negative supply rail, a plurality of amplifiers interposed between said voltage sources and said resistor connection points, each of said amplifiers comprising:

first and second p-type transistors having respective control inputs, said first p-type transistor's control input connected to a respective one of said voltages sources providing a correction voltage which is closer to said negative supply rail than said positive supply rail, a first switchable current source connected to supply tail current to said p-type transistors when enabled in response to a first control signal, said p-type transistors connected to provide a first differential output current when said tail current is supplied which varies with a differential input signal applied to said p-type transistors' control inputs, first and second n-type transistors having respective control inputs, said first n-type transistor's control input connected to a respective one of said voltages sources providing a correction voltage which is closer to said positive supply rail than said negative supply rail, a second switchable tail current source connected to supply tail current to said n-type transistors when enabled in response to a second control signal, said n-type transistors connected to provide a second differential output current when said tail current is supplied which varies with a differential input signal applied to said n-type transistors' control inputs, an output stage which receives said first and second differential output currents and is arranged to produce an output voltage at an output terminal which varies with said first and second differential output currents, said output terminal being said amplifier's output, said output voltage coupled back to said second control inputs, and a control circuit which provides said first and second control signals such that said first switchable current source is enabled and said second switchable current source is disabled when the voltage at said first p-type transistor's control input is to be amplified by said amplifier, and said second switchable current source is enabled and said first switchable current source is disabled when the voltage at said first n-type transistor's control input is to be amplified by said amplifier, each of said amplifier outputs connected to a respective one of resistor connection points, said control circuit arranged to control said first and second switchable current sources in synchronization with the switching of said pixels' second terminal such that the polarity of the voltages across said pixels is periodically reversed.

* * * * *